United States Patent [19]
Messick et al.

[11] Patent Number: 5,631,615
[45] Date of Patent: May 20, 1997

[54] FREE WOUND ELECTROMAGNETIC DEFLECTION YOKE

[75] Inventors: Scott A. Messick, Pleasant Valley; Joseph J. Senesi, Poughquag, both of N.Y.

[73] Assignee: International Business Machines Corporation, Armonk, N.Y.

[21] Appl. No.: 460,419

[22] Filed: Jun. 2, 1995

[51] Int. Cl.$^6$ ........................................ H01H 1/00
[52] U.S. Cl. ............................. 335/213; 335/210
[58] Field of Search ........................ 335/210, 213; 250/396 R, 396 ML; 336/84 C

[56] References Cited

U.S. PATENT DOCUMENTS 4,251,728  2/1981  Pfeiffer et al. .
4,629,899  12/1986  Plies .
5,221,844  6/1993  van der Mast et al. .
5,264,706  11/1993  Oae et al. .

*Primary Examiner*—Lincoln Donovan
*Attorney, Agent, or Firm*—Whitham, Curtis, Whitham & McGinn; Charles W. Peterson, Jr.

[57] ABSTRACT

A free-wound electromagnetic yoke is formed by winding the X-axis with a continuous piece of heat bondable wire wound around a plurality of coil forms positioned on a mandrel and turned by a lathe. After winding, the mandrel is heated to cause the windings to form solid coils. After cooling, the solid coils are removed from the mandrel and from the coil forms. The same process is repeated for the Y-axis. The solid coils for both the X-axis and the Y-axis are placed in a toroidal support ring to form an electromagnetic yoke.

5 Claims, 6 Drawing Sheets

FREE WOUND ELECTROMAGNETIC DEFLECTION YOKE

BACKGROUND OF THE INVENTION

1. Field of the Invention

The present invention generally relates to electromagnetic lenses and yokes and, more particularly, to a simplified method for winding the coils of electromagnetic lenses and yokes.

2. Description of the Prior Art

Yokes and electromagnetic lenses are widely used in electron beam tools, electron microscopes, and cathode ray tubes (CRTs). Yokes and lenses employing toroidal magnetic deflection coils are commonly used electron beam lithography systems for focusing an electron beam on to a substrate for submicron patterning of semiconductor devices.

U.S. Pat. No. 4,251,728 to Pfeiffer shows an example of a toroidal magnetic deflection yoke. The operation of such a yoke is fairly straightforward. Opposing rectangular windings are arranged in a circle to form a toroid. For example, FIG. 1A shows one pair of opposing coils, 10 and 10', arranged at opposite sides of a circle 12 forming a toroidal yoke. Typically, one of these coils controls the electron beam deflection in the Y direction and the other coil in the X direction. In operation, a deflection current is passed through the coils from point A to point B through interconnection 14. The deflection current travels in a direction specified by the arrows $I_o$ and $I_i$. Magnetic fields 16 are created in each leg of the coils in a direction prescribed by the well-known right-hand rule. An electron beam 18 traveling through the center of the toroid, between opposing legs of the coils, is influenced by the aggregate of the magnetic fields 16 and deflected to a new path 18'.

FIG. 1B a shows a sectional view of the windings shown in FIG. 1A taken along line 2–2'. It can be seen that the electron beam 18 can be deflected in either direction by controlling the deflection currents in the coils 10 and 10'.

Presently, electromagnetic coils are formed by winding wire into multiple radial cut grooves cut a plastic form. The method used for winding the form to make the coils is characterized as being difficult and time consuming. Proper winding requires alternating between the X and the Y windings. As the number of radial cut grooves and the number of turns increases, so does the degree of difficulty and the time involved.

FIG. 2 shows a top view of a traditional toroidal yoke. A plastic form having slots numbered from 1 to 19, starting at the twelve o'clock position and counting counter clockwise, form both the X and Y coil axes which make up the toroidal yoke. FIG. 3 shows the toroidal yoke of FIG. 2, opened up along line 3–3'. As is readily apparent, the winding process is quite involved. Referring now collectively to FIGS. 2, 3, and 4A–D, the recommended winding procedure is as follows:

Step 1. Take three spools no larger than 1.5 inches in diameter and wrap 130 inches of 20 AWG wire onto each of two spools. Label the first spool "X1" and the second spool "X2". Wrap 240 inches of 20 AWG wire onto the third spool and label it spool "Y".

Step 2. Take the spool labeled "X2" and unwrap three inches of wire and label the end "X2 Start". Beginning at slot No. 19 wrap according to the view shown in FIG. 4D. Tape the wire to the form.

Step 3. Take the spool labeled "Y" and unwrap six inches of the wire and label the end "Y Start". Beginning at slot No. 18, wrap according to the winding style shown in FIG. 4A. Continue to wrap in a counter clockwise direction to slot No. 20 according to the winding style shown in FIG. 1A. Repeat this for slots Nos. 1 and 2. Tape the wire to the form.

Step 4. Take the "X2" spool and go counter clockwise to slot No. 17 and wrap according to the winding style shown in FIG. 4C. repeat this for slots Nos. 16 and 15. Tape the wire to the form.

Step 5. Take the "X1" spool and unwrap six inches of wire and label the end "X Start". Beginning at slot No. 3, wrap according to the winding style shown in Figure shown in FIG. 4D. Tape the wire to the form.

Step 6. Take the "Y" spool and go counter clockwise to slot No. 4 wrapping according to the style shown in FIG. 4A. Now bring the spool clockwise to slot No. 14 and wrap according to the winding style shown in FIG. 4B. Tape the wire to the form.

Step 7. Take the "X2" spool and go clockwise to slot No. 13 wrapping according to the winding style shown in FIG. 4C. Bring the spool counter clockwise to slot No. 1. Remove the wire from the spool and label it "X Return".

Step 8. Take the "Y" spool and go counter clockwise to slot No. 12 wrapping according to the winding style shown in FIG. 4B. Repeat this for slot Nos. 11 and 10. Put a spacer into slot No. 9 at this point. The spacer should be two layers of wire, three rows wide. Take the "Y" spool clockwise to slot No. 8 and wrap according to the winding style shown in FIG. 4B. Take the spool counter clockwise to slot No. 16. Remove the wire from the spool an label it "Y return".

Step 9. Take the "X1" spool and go counter clockwise to slot No. 5 wrapping according to the winding style shown in FIG. 4D. Repeat this for slots Nos. 6 and 7. Remove the spacers from slot No. 9. Remove the wire from the spool. Take the wire and thread it into slot No. 9 according to the winding style shown in FIG. 4D. Take the end of the wire clockwise to the space between slot No. 1 and slot No. 20. Strip both this and the end of the wire labeled "X2 Start" about 0.38 inches apart. Put a one inch length of heat shrink tubing onto the wire labeled "X1" and overlap the wire ends 0.38 inches. Solder these wires together and cover joint with shrink tubing.

Step 10. Take "X Start" to slot No. 16 and label it "X Drive". Twist it together with "X Return"

Step 11. Take "Y" to slot No. 1 and label it "Y Drive". Twist it together lightly with "Y return"

This process is time consuming and prone to mistakes. For instance, as the number of turns goes up, so does the degree of difficulty and time involved. Keeping uniform tension on the wires and keeping the wire straight is also a difficult task. Any slack or tangling results in an unbalanced, non-functioning yoke. Cooling is also a problem with this type of wound yoke since, at best, only about 30% of the coil area facing away from the plastic form is accessible to a cooling medium. This results in poor, unbalanced cooling. For high power applications this situation is unacceptable since the increased amounts of heat that is generated will adversely effect yoke performance.

SUMMARY OF THE INVENTION

It is therefore an object of the present invention to provide a simplified method for winding a toroidal yoke.

It is yet another object of the present invention to provide a free-wound yoke where the X axis and a Y axis are wound separately;

It is yet another object of the present invention to provide a yoke which can be more efficiently cooled.

A free wound toroidal yoke is formed using a reusable mandrel mounted to a lathe. The mandrel is essentially a straight shaft. Coil winding fixtures for either the X or the Y axis are slid on to the mandrel separated from each other with spacers and ejector plates. A starter end of bondable wire is affixed to the first winding fixture and held taut. By turning the lathe manually to rotate the mandrel, the wire begins to wind around the first fixture in a uniform fashion. When the requisite number of winds is wound around the first fixture, the wire is pulled over to the second fixture and again the lathe is rotated until the requisite number of winds is reached. This procedure repeated for each of the fixtures on the mandrel until the last fixture is wound. When the winding is complete there is one complete axis, either the X or the Y, comprised of a number of individual coils all wound with a continuous piece of bondable wire. The entire mandrel assembly is then heated in an oven to bond the coiled wire to form solid coils. The same procedure is performed for the remaining axis. Once cooled, the coil fixtures are slipped off of the mandrel and the solid coils are removed from the fixtures via the ejector plates. The coils for both the X and the Y axes are placed into a slots around a toroid shaped support ring to form an electromagnetic yoke.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
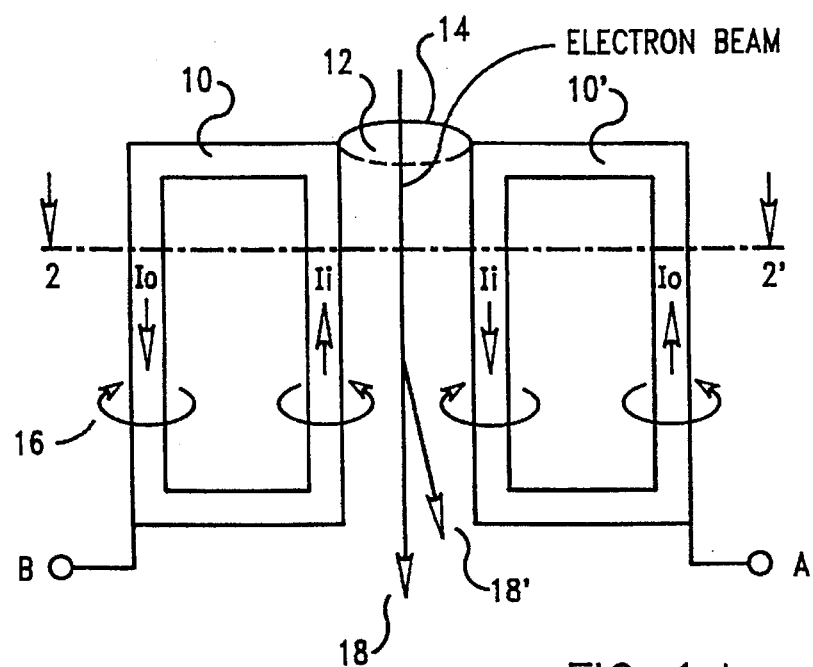
FIG. 1A is prior art showing two opposing coils in a typical toroidal yoke.
FIG. 1B is a sectional view of the coils shown in FIG. 1A taken along sectional line 2–2'.
Figure 1:
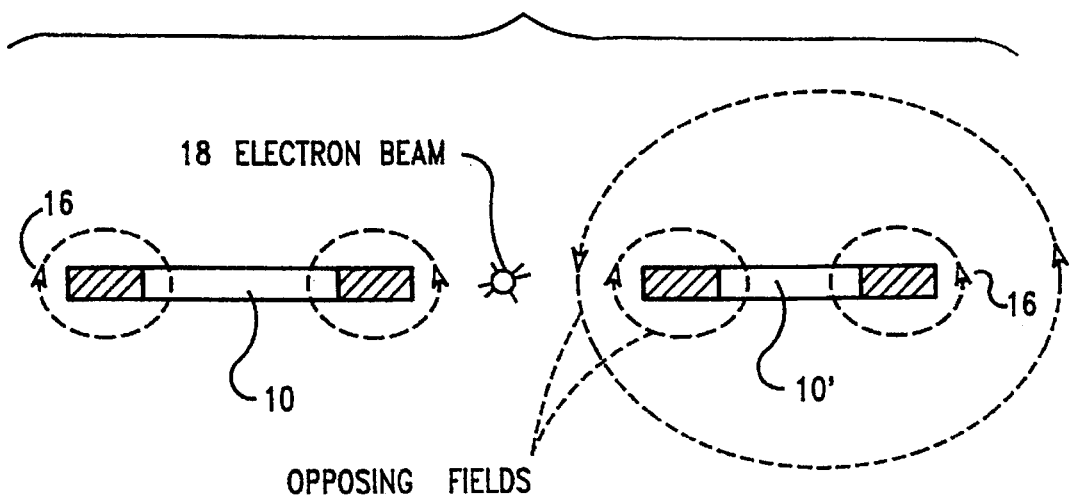
Figure 2:
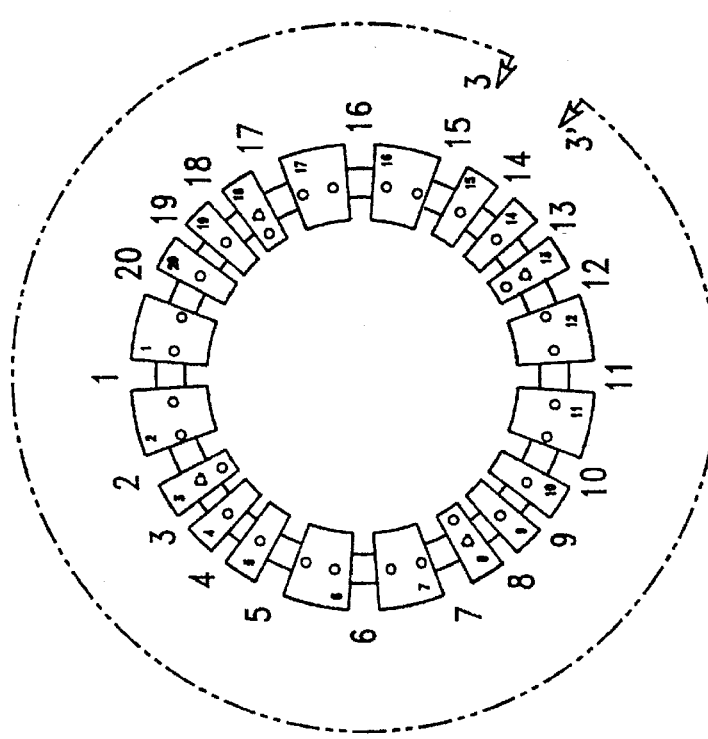
FIG. 2 is a prior art toroidal yoke winding.
Figure 3:
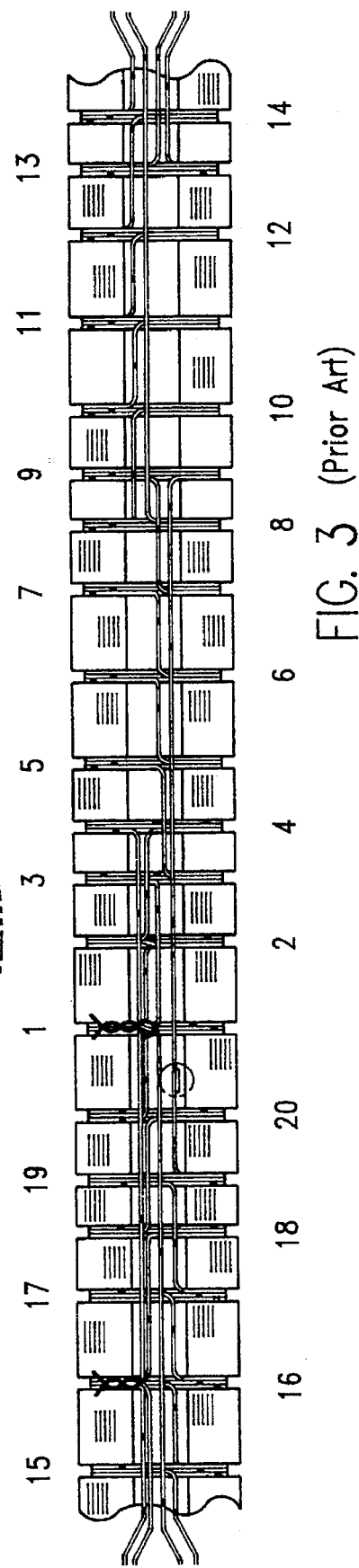
FIG. 3 is the prior art toroidal yoke shown in FIG. 2 opened up along line 3–3' illustrating the complicated winding pattern for both the X and the Y axes.
Figure 4B:
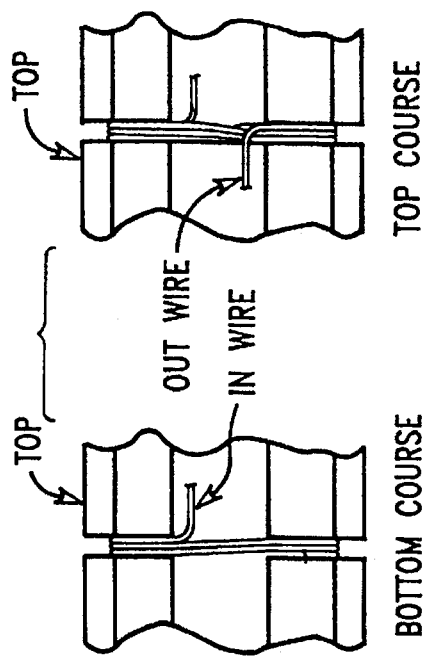
FIGS. 4A–4D are winding styles required to form the prior art yoke shown in FIGS. 2 and 3.
Figure 4D:
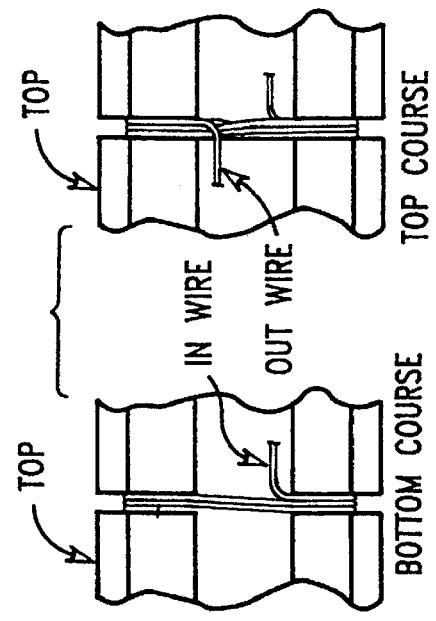
Figure 4A:
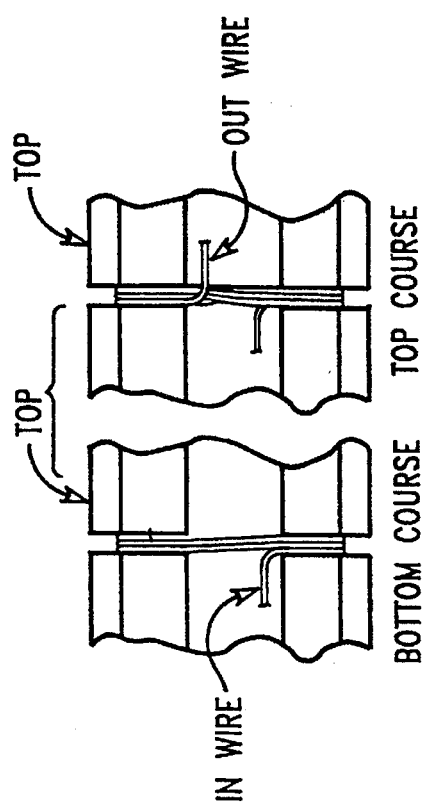
Figure 4C:
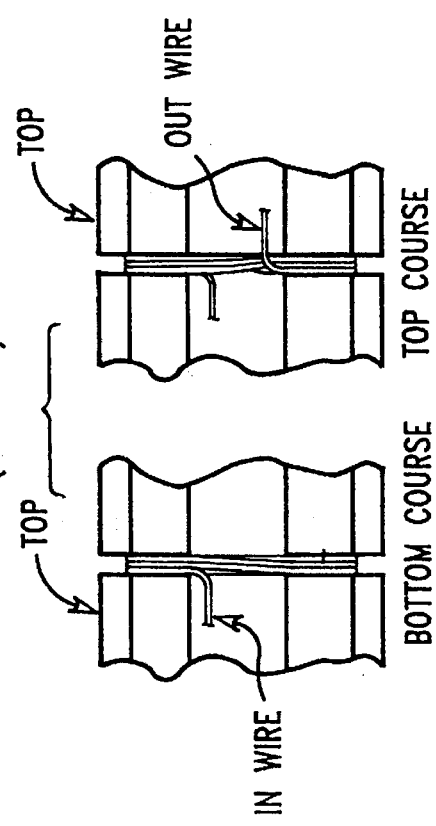
Figure 5:
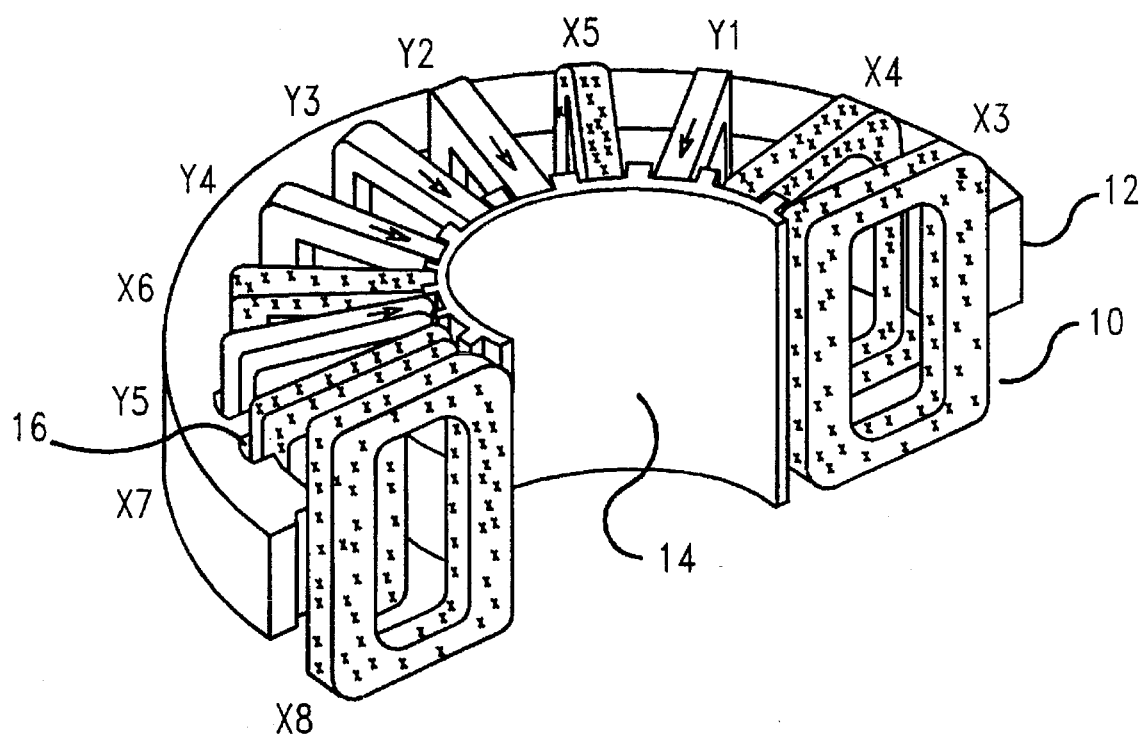
FIG. 5 is an isometric view of the toroidal yoke according to the present invention.

Referring now to the drawings, and more particularly to FIG. 5, there is shown an isometric view of the free wound yoke according to the present invention. Only one half of the yoke is shown for illustrative purposes. The yoke is comprised of individual free wound coils 10 affixed in an outer toroidal support ring 12 and an inner toroidal support ring 14. Corresponding slots 16 in the outer ring 12 and the inner ring 14 hold the free wound coils 10 in place. For illustrative purposes, the coils comprising the X-axis are shaded while the coils comprising the Y-axis are not.

Figure 6:
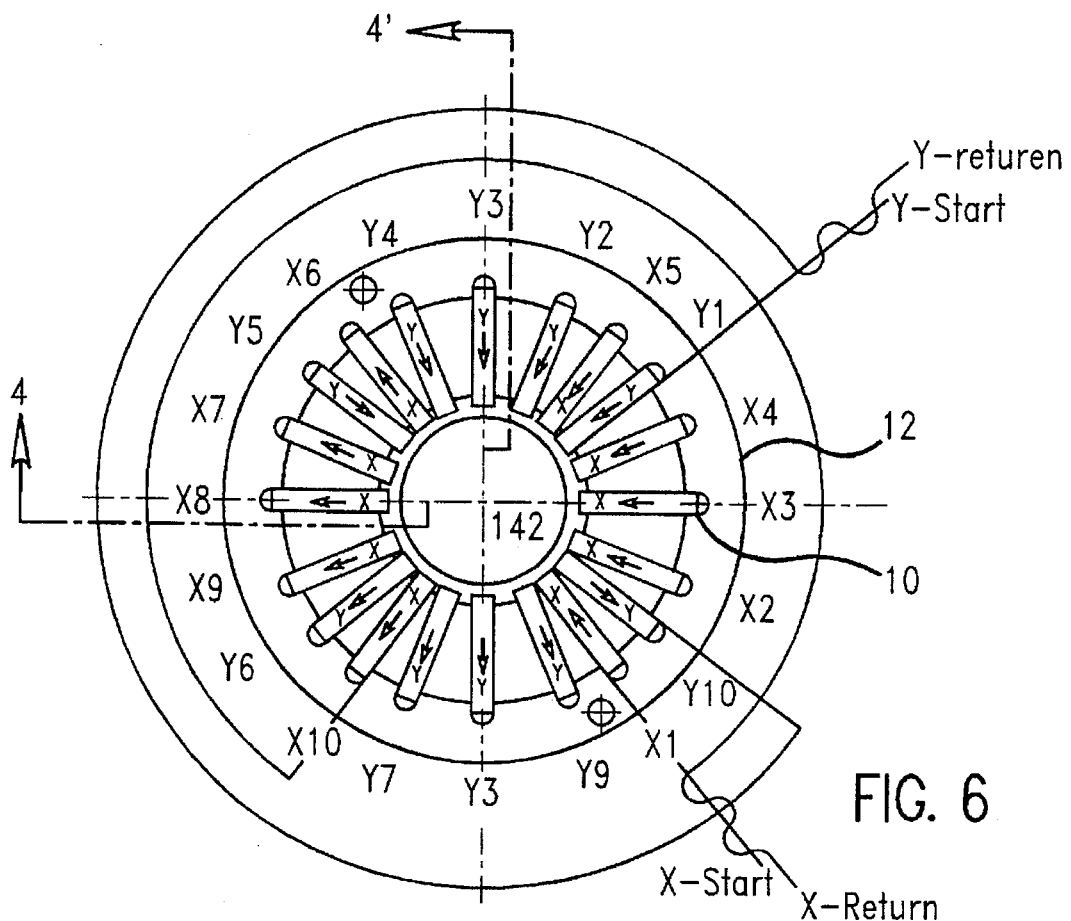
FIG. 6 is a top view of the toroidal yoke according to the present invention.

FIG. 6 shows a top view of the free wound toroidal yoke comprised of twenty coils. The X-axis is comprised of coils labeled X1 through X10. Likewise, the Y-axis coils are comprised of coils labeled Y1 through Y10. Arrows on the coils indicate the direction of the wind. All of the X-axis coils are formed from a continuous strand of wire with the start of the wire labeled "X-Start" at coil X1, and the end of the wire labeled "X-End" at coil X10. Similarly, all of the Y-axis coils are formed from a continuous strand of wire with the start of the wire labeled "Y-Start" at coil Y1, and the end of the wire labeled "Y-End" at coil Y10.

Figure 7:
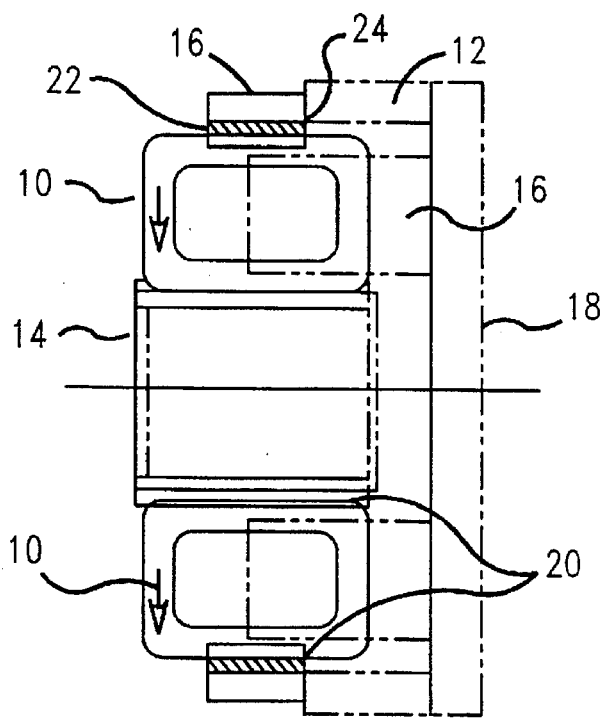
FIG. 7 is a sectional view taken along line 4–4' of FIG. 6.

FIG. 7 shows a sectional view taken along line 4–4' of FIG. 6. The individual coils 10 fit into the outer toroidal ring 12 and an inner toroidal ring 14 and are aligned with an alignment fixture 16 secured to a base plate 18. The Y-axis coils are connected via Y-interconnect wire 22 and the X-axis coils are connected together via X-interconnect wire 24. Since the coils are free wound, they can be placed in the support rings, 12 and 14, so that the coil wind goes in either direction. The arrows on the coils 10 indicate the direction of the wind. The individual coils 10 are fixed in place with an epoxy 20.

Figure 8:
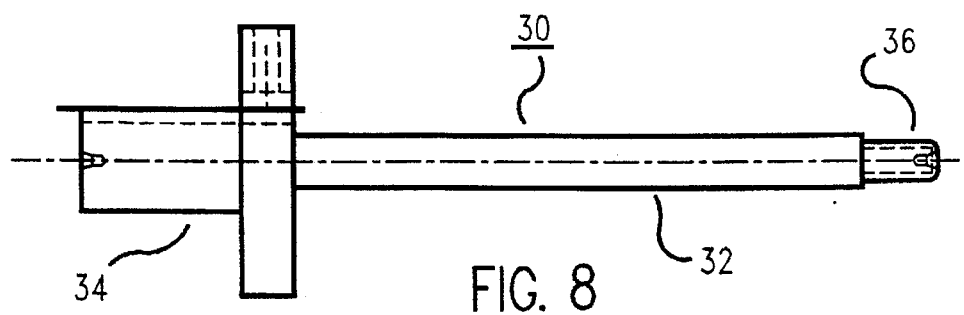
FIG. 8 is a view of a winding mandrel used to form free wound electromagnetic coils.

Turning now to FIG. 8, there is shown a reusable mandrel 30 used for winding the free wound coils. The mandrel is essentially a long shaft 32 having a adaptor 34 at one end designed to fit into a lathe (not shown). The opposite end of the shaft has a threaded portion 36 for securing a nut 38.

Figure 9:
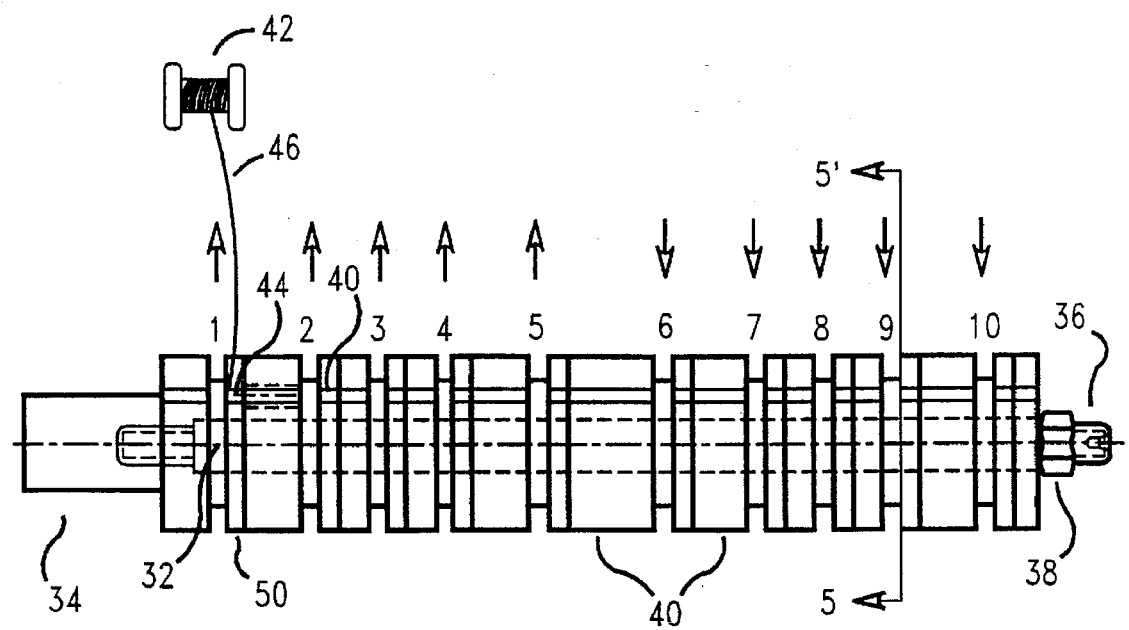
FIG. 9 is a view of the winding mandrel having fixtures comprising a complete axis for the toroidal yoke.
Figure 10:
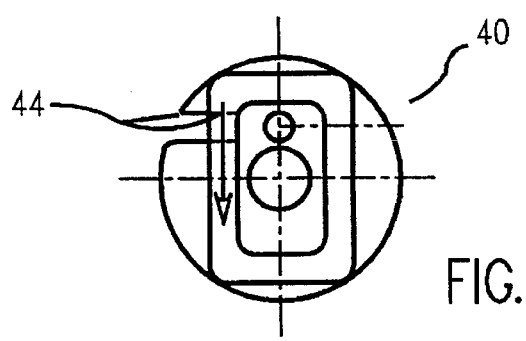
FIG. 10 is a view of a winding fixture taken along line 5–5' of FIG. 9.

The method for winding the free-wound coils is shown with reference to FIG. 9 which shows all of the winding fixtures 40, in this example ten fixtures number from left to right, comprising a complete axis, either the X-axis or the Y-axis. The winding fixtures 40 are evenly spaced along the shaft 32 of the mantle 30. A more detailed view of the winding fixture 40 is shown in FIG. 10. In the preferred embodiment, a spool 42 of 20 gage bondeze wire is used. A starter end of bondable wire is affixed to the first winding fixture and held taut in a wire groove 44. As the lathe begins to rotate the mandrel 30, the wire 46 begins to wind around the first fixture 40 in a uniform fashion. When the requisite number of winds is wound around the first fixture, the wire is moved to the wire groove 46 of the second fixture and the lathe again begins to rotate until the requisite number of winds is reached. For the yoke in the present example, thirty-nine turns is used. This procedure repeated for each of the fixtures on the mandrel until the last fixture is wound. Arrows above each fixtures 40 indicate the direction of the wind. As shown, starting with fixture number 6 and continuing through fixture number 10, the direction of the lathe, and hence the direction of the wind, has been reversed. When the winding is complete there is one complete axis, either X or Y, comprised of a number of individual coils all connected with a continuous piece of wire 46.

The entire mandrel assembly 30 is then heated to bond the coiled wire. For 20 gage bondeze wire the coils 10 are baked at 100°–150° C. for about four hours until the coils are bonded such that each coil forms a solid mass. After the coils 10 are completely cool, the nut 38 is removed and the fixtures 40 are slid from the mandrel 30. The coils 10 are then removed from their respective fixtures 40 one by one with the ejector plates 50. The mandrel 30 is reusable and can be used to preform the same procedure for the remaining axis.

The solid coils 10 for both the X-axis and the Y-axis are placed into a slots around a toroid shaped support ring to form a yoke, as shown in FIG. 6. The resultant yoke is formed of free wound coils. Unlike the prior art, keeping the wires straight is not a problem since as the fixture is revolved, it clearly exposes the next surface where the wire is to be laid. This make it very easy to keep the wire straight and to keep uniform tension on the wire. Further, the yoke formed by this method allows for more uniform cooling since there is no plastic form through the center of the coils and approximately 90% of the coils surfaces can be exposed to a cooling medium.

While the invention has been described in terms of a single preferred embodiment, those skilled in the art will recognize that the invention can be practiced with modification within the spirit and scope of the appended claims.

We claim:

1. A free wound electromagnetic yoke, comprising:

an X-axis formed of a first continuous length of wire forming a first plurality of coils, each of said first plurality of coils formed to be an individual solid mass;

a Y-axis formed of a second continuous length of wire forming a second plurality of coils, each of said second plurality of coils being formed to be an individual solid mass;

support means for holding said X-axis and said Y-axis in a toroidal formation.

2. A free wound electromagnetic yoke as recited in claim 1 wherein said support means comprises:

an outer toroidal shaped ring; and an inner toroidal shaped ring coaxial with said outer toroidal ring, said outer toroidal ring and said inner toroidal ring having corresponding slots for receiving each one of said first and said second plurality of coils.

3. A free wound electromagnetic yoke as recited in claim 2 wherein each one of said first and said second plurality of coils is fixed to said corresponding slots with an adhesive.

4. A free wound electromagnetic yoke as recited in claim 1 wherein said first continuous length of wire and said second continuous length of wire is heat bondable wire.

5. A free wound electromagnetic yoke as recited in claim 1 wherein each one of said first and said second plurality of coils is rectangularly shaped.

* * * * *